(12) United States Patent
Mackin et al.

(10) Patent No.: US 7,301,149 B2
(45) Date of Patent: Nov. 27, 2007

(54) APPARATUS AND METHOD FOR DETERMINING A THICKNESS OF A DEPOSITED MATERIAL

(75) Inventors: Thomas J. Mackin, Urbana, IL (US); Chad R. Sager, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 111 days.

(21) Appl. No.: 10/839,967

(22) Filed: May 6, 2004

(65) Prior Publication Data
US 2005/0247877 A1    Nov. 10, 2005

(51) Int. Cl.
G01N 21/59 (2006.01)
G01N 21/86 (2006.01)
G01B 11/02 (2006.01)

(52) U.S. Cl. .............................. 250/341.1; 250/341.6; 250/559.27; 356/504

(58) Field of Classification Search ............. 250/341.1, 250/341.6, 341.8, 559.28, 559.27; 356/630, 356/632, 504, 432
See application file for complete search history.

(56) References Cited

U.S. PATENT DOCUMENTS

| | | | | |
|---|---|---|---|---|
| 3,869,211 A | * | 3/1975 | Watanabe et al. | 356/632 |
| 4,177,372 A | * | 12/1979 | Kotera et al. | 117/39 |
| 4,555,767 A | * | 11/1985 | Case et al. | 250/341.4 |
| 4,710,030 A | * | 12/1987 | Tauc et al. | 356/432 |
| 5,126,165 A | * | 6/1992 | Akihama et al. | 427/572 |
| 5,549,756 A | * | 8/1996 | Sorensen et al. | 118/715 |
| 5,782,974 A | * | 7/1998 | Sorensen et al. | 117/82 |
| 5,985,032 A | * | 11/1999 | Eriguchi | 118/712 |
| 6,175,416 B1 | * | 1/2001 | Maris et al. | 356/630 |
| 6,392,756 B1 | * | 5/2002 | Li et al. | 356/632 |
| 6,633,831 B2 | * | 10/2003 | Nikoonahad et al. | 702/155 |
| 6,891,627 B1 | * | 5/2005 | Levy et al. | 356/625 |
| 6,917,433 B2 | * | 7/2005 | Levy et al. | 356/630 |
| 6,946,394 B2 | * | 9/2005 | Fielden et al. | 438/680 |
| 6,976,782 B1 | * | 12/2005 | Steger | 374/1 |
| 2002/0088952 A1 | * | 7/2002 | Rao et al. | 250/559.45 |
| 2004/0026240 A1 | * | 2/2004 | Shidoji et al. | 204/298.03 |
| 2004/0061057 A1 | * | 4/2004 | Johnson et al. | 250/341.1 |

OTHER PUBLICATIONS

Carslaw, H.S., Jaeger, J.C., "*Conduction of Heat in Solids,*" Oxford University Press, New York 1959, pp. 105-109.
Decker, C, "*Thin Film Thickness Measurement by Heat Transfer and Infrared Imaging,*" Master's, Thesis, University of Illinois, Urbana-Champaign, May 2003.
Decker, C.A., Mackin, T.J., "*Measuring Film Thickness Using Infrared Imaging,*" Thin Solid Films 473 (2005), pp. 196-200.

(Continued)

*Primary Examiner*—David Porta
*Assistant Examiner*—Faye Boosalis
(74) *Attorney, Agent, or Firm*—Greer, Burns & Crain, Ltd.

(57) ABSTRACT

Method and apparatus for determining a thickness of a deposited material. Energy is passed through the deposited material, wherein some of the energy is transmitted. The transmitted energy is received, and the received energy is used to determine a thickness of the deposited material.

21 Claims, 13 Drawing Sheets

OTHER PUBLICATIONS

Decker, C. and T. J. Mackin, "*Thin Film Thickness Measurement Using Conduction and IR Transmission*," Proceedings of the Society for Experimental Mechanics, Milwaukee, WI, Jun. 2002.

Decker, C., Mackin, T.J., "*Thin Film Thickness Measurement Using Infrared Transmission*," Proceedings of the Annual Meeting of the Society for Experimental Mechanics, Portland, OR, Jun. 2001.

Decker, Carrie A., Mackin, Thomas J., "*Use of Thermoelastic Stress Analysis to Determine Paint Thickness*," Department of Mechanical and Industrial Engineering, University of Illinois, Urbana, IL.

Lopez, F., Bernabeu, E., "*Refractive Index of Vacuum-Evaporated SiO Thin Films: Dependence on Substrate Temperature*," Thin Solid Films, vol. 191, pp. 13-19, Oct. 1990.

Mackenzie, A.K., "*Effect of Surface Coatings on Infra-Red Measurements of Thermoelastic Responses*," Stress and Vibration: Recent Developments in Industrial Measurement and Analysis, SPIE vol. 1084, pp. 59-71, 1989.

McKelvie, J., "*Consideration of the Surface Temperature Response to Cyclic Thermoelastic Heat Generation*," Stress Analysis by Thermoelastic Techniques, SPIE vol. 731, pp. 44-54, 1987.

Moses, A.J., Handbook of Electronic Material, vol. 1, Optical Material Properties, 1967, pp. 6-7, 36-37, 54-55.

Sager, C. R. and T. J. Mackin, "*In-Situ Deposition Measurement of Thin Film Thickness Using a Novel 2-D Optical Technique*," Proceedings of the Society for Experimental Mechanics, Los Angeles, CA, Jun. 2004.

* cited by examiner

APPARATUS AND METHOD FOR DETERMINING A THICKNESS OF A DEPOSITED MATERIAL

STATEMENT OF GOVERNMENT INTEREST

This invention was made with Government assistance under National Science Foundation Grant No. 02-17469. The Government has certain rights in the invention.

BACKGROUND OF THE INVENTION

Determining the thickness of materials grown or deposited onto a substrate is crucial to the performance of an end product in various areas such as, but not limited to: microelectronics, such as semiconductor and integrated circuit (IC) fabrication; coatings, such as thermal barrier coatings; precision optics; etc. For example, the thickness of thin films grown or deposited onto a substrate controls the resistivity and heat generated, among other variables, in a design. Thicknesses that are too great or too little can adversely affect the performance of a device, thereby affecting the yield of a process run. Film uniformity also affects the performance of a film, and accordingly the performance of a device incorporating a film.

Thickness measurement of films, for example, can generally be grouped into two categories: contact and non-contact. Contact methods include atomic force microscopy (AFM) and use of a profilometer. However, these contact methods typically cannot be used for in-situ film inspection.

Non-contact methods include gravimetric, eddy current, and optical methods. A quartz crystal monitor (QCM) gravimetric method is widely identified for in-situ characterization of thin film thicknesses. QCM measures film thicknesses by monitoring the frequency shift of a quartz crystal as material is deposited on it. Though this method is in-situ, it is also remote. That is, film thickness monitoring does not actually happen on the sample on which the film is being deposited.

Use of eddy currents to detect film thicknesses is useful for measuring metal film thicknesses, but requires large scanning times that are not suitable for in-situ measurements. Also, some in-situ methods of deposition create electromagnetic fields that may affect eddy current measurements.

Optical methods can be implemented to monitor film growth/deposition and measure film thicknesses. Such methods are designed such that electromagnetic fields do not interfere with them, and they can be done in real time. Optical methods, therefore, are the only methods that can be implemented into a real-time production environment to improve the production yield while increasing the production rate.

Most optical methods rely on the amount of light reflected and/or transmitted by the substrate. Ellipsometry uses polarized light to determine film thickness and other film parameters, but is limited to point measurements due to the necessary polarizers and other adjustments that need to be made to obtain measurements. This makes ellipsometry unsuitable for real-time full-field measurements. While several point measurements can be made by ellipsometry to take thickness maps, this takes a significant amount of time and is not suitable for in-situ measuring. Other methods that do not use polarized light make use of the interference of light, but are confined to point measurements or very small areas. Point and small area measurements also provide little to no information about the uniformity of a film.

SUMMARY OF THE INVENTION

A method is provided for determining a thickness of a material. Energy is passed through the material, wherein some of the energy is transmitted. The transmitted energy is received, and the received energy is used to determine a thickness of the material. Apparatuses are also provided for determining a thickness of a material.

DETAILED DESCRIPTION

Figure 1:
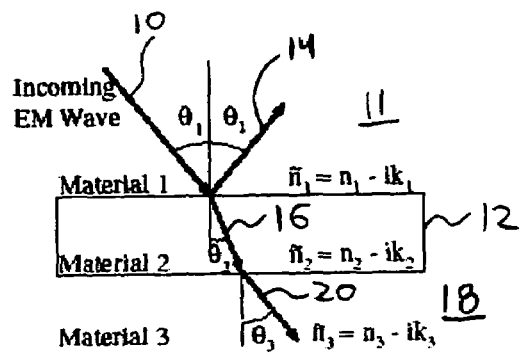
FIG. 1 shows an electromagnetic wave passing through a two-interface system including three materials.

Preferred embodiments and methods of the present invention determine a thickness of a deposited material. Embodiments of the invention, for example, may determine thickness of a film on a substrate or of a freestanding film. A preferred method includes passing electromagnetic energy through the film, either in-situ or ex-situ. The film attenuates some of the energy as it passes through the film, and transmits and reflects the remaining energy. The transmitted energy is received, and the received energy is used to measure the thickness of the film.

A preferred method of the invention illuminates the sample by periodically interrupting an illuminating energy source. For example, the radiated energy can be interrupted by passing an optical chopper between the source of the radiated energy and the deposited material. Alternatively, radiating energy may be obtained using a controller that causes controlled oscillations in the radiation, for example, by sinusoidally controlling the source power.

The transmitted energy may be received by a camera, for example, such as an infrared camera. High signal sensitivity is obtained by comparing camera images captured when the energy is being radiated, and when the radiant energy is being interrupted. In a preferred embodiment, the camera and an apparatus for radiating energy can be linked to produce pairs of images that can be subtracted to remove any ambient effects. This linking of the camera and illuminating source can be accomplished using a detector, such as a phototransistor, to detect when energy is being radiated or not radiated, and the phototransistor can be coupled to the camera for triggering production of the pairs of images.

In such a preferred embodiment, the images produced when the energy is being interrupted are used to filter the images produced when the energy is being radiated. The received energy may also be normalized, for example, by dividing the received energy at any film thickness by the received energy when no film has been deposited. This occurs, for example, by receiving transmitted energy before the film is deposited, or receiving transmitted energy through a portion of a sample configured such that the film is deposited on part of a substrate, but not on another part of the substrate.

Preferably, the images are filtered by subtracting images to produce a filtered image. The images allow a two-dimensional view of the film. Spatial resolution of the preferred system can be determined by the area of individual pixels and the magnification of the viewing optics. The images can represent a full-field of the film for a particular thickness (or thicknesses, by pixel).

A deposition chamber can be fitted with an apparatus for determining film thickness. The chamber may be fitted with mirrors, light paths, filters, or other components for reflecting, transmitting, or filtering light for performance of a preferred thickness determination method. By coupling an apparatus for in-situ thickness determination with an apparatus for depositing film, deposition can be controlled, in real-time, within a deposition chamber.

One preferred embodiment of the present invention exploits the transmission, reflection and absorption properties of electromagnetic waves passing through materials to create a full-field, two-dimensional map of the thickness of a film. However, other material depositions in addition to thin films may be measured, including the thickness of bulk samples of nominally transparent materials.

Measurement of a thin film, for example, may make specific use of the transmittance of an incident electromagnetic wave such as light. These preferred embodiments also exploit the strong correlation between material thicknesses and transmission in materials opaque to electromagnetic waves at moderate thicknesses, yet transparent to such waves when sufficiently thin. The approach is broadly applicable to any material, so long as the wavelength of the IR and/or the sample thickness is of a scale that allows for transmission of the radiation.

Referring now to the drawings, according to electromagnetic principles, the transmissivity of a material system for a system such as that shown in FIG. 1 generally is defined as the ratio of the transmitted flux to the incident flux for an incoming electromagnetic wave:

$$\tau = \frac{\Delta q_t}{\Delta q_i} = |t_{13}|^2 \frac{n_3}{n_n} \quad (1)$$

In equation (1), $\Delta q_t$ is the transmitted flux, $\Delta q_i$ is the incident flux, $t_{13}$ is the complex amplitude transmission coefficient where materials one and two meet layer three, and $n_n$ is the index of refraction for material n.

As illustrated in FIG. 1, an incoming electromagnetic wave 10 passing from a material 11 and entering a second material 12 at an angle of incidence $\theta_1$ is reflected at an equal angle $\theta_1$ (wave 14), and refracted at angle $\theta_2$ (wave 16), as it passes through the material. When wave 16 meets a third material 18, it too generates both a reflected and a refracted transmitted wave, 20, at $\theta_3$.

The interface between the materials 11, 12, 18 will reflect a portion of the incident radiation, and may lead to interference effects. Interference effects, depending on the specifics of the system, are present whenever there is more than one interface in the system. To determine $t_{13}$, a summation of all the waves exiting the interface between materials two and three 12, 18 must take place, resulting in the transmitted wave 20. It can be shown that this summation is a geometric series. The complex amplitude transmission coefficient can be determined as:

$$t_{13} = \frac{t_{12} t_{23} e^{-i\beta_2}}{1 + r_{12} r_{23} e^{-i2\beta_2}} \quad (2)$$

In this equation, $t_{12}$ is the complex transmission coefficient for an electromagnetic wave encountering the interface between material one, denoted by 11 in the figure, and material two, denoted as 12, and originating from inside material one. $t_{23}$ is the complex amplitude transmission coefficient at the interface between material two and material three, denoted as 18 in the figure, $r_{12}$ is the complex amplitude reflection coefficient at the interface between materials one and two, $r_{23}$ is the complex amplitude reflection coefficient at the interface between materials two and three, and $\beta_2$ is:

$$\beta_2 = \frac{2\pi n_2 h_2}{\lambda} \quad (3)$$

In equation (3), $h_2$ is the thickness of material two, $\lambda$ is the wavelength of the electromagnetic wave in the system, and $n_2$ is the complex index of refraction for material two. A similar equation expresses the complex amplitude reflection coefficient. It is:

$$r_{13} = \frac{r_{12} + r_{23}e^{-i2\beta_2}}{1 + r_{12}r_{23}e^{-i2\beta_2}} \quad (4)$$

In effect, equation (2) combines material one and material two to provide an effective complex amplitude transmission coefficient. This method of combining materials lends itself to implementation into computer codes to solve for the reflection and transmission coefficients in a multi-layered system.

Figure 2:
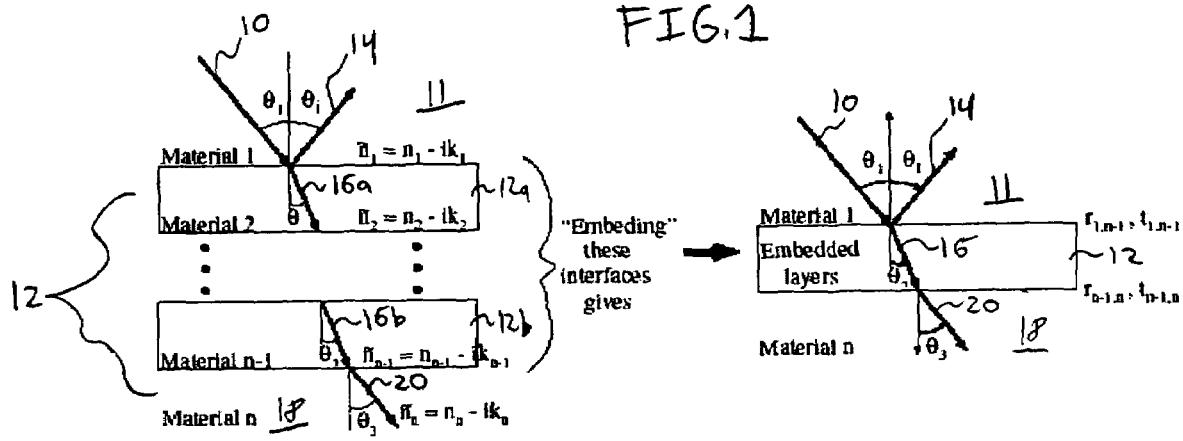
FIG. 2 is a schematic showing a technique for deriving an equivalent model of layers of interface materials.

FIG. 2 demonstrates the underlying idea of such a code, where the wave, identified as 10, passes through material one, identified as 11, and passes through a series of materials, indicated in FIG. 2 as 12a and 12b, representing materials 2 to n−1. A first refracted wave 16a passes through material 12a, and similarly a second (or other ordinal number) wave 16b passes through material n−1 (part 12b). Embedding these interfaces provides the associated waves 10, 16, and 20 shown in the right half of FIG. 2. More specifically, the form of the equation for transmissivity is given by:

$$\tau = |t_{1,n}|^2 \frac{n_n}{n_1} = \left| \frac{t_{1,n-1}t_{n-1,n}e^{-i\beta}}{1 + r_{1,n-1}r_{n-1,n}e^{-i2\beta}} \right|^2 \frac{n_n}{n_1} \quad (5)$$

In equation (5), the subscript n is the indexing variable. The value for $\tau$ is readily attained once $r_{i,j}$ and $t_{i,j}$ are known. Numerical values for $r_{i,j}$ and $t_{i,j}$ are calculated from the Fresnel Equations, given by:

$$t_{i,j} = \frac{2n_i}{n_j + n_i}, \; r_{i,j} = \frac{n_j - n_i}{n_j + n_i} \quad (6)$$

In equation (6), $t_{i,j}$ is the complex transmission coefficient for an electromagnetic wave encountering the interface between material i and material j, where the wave is moving through material i to material j. Similarly, $r_{i,j}$ is the complex reflective coefficient for an electromagnetic wave encountering the interface between material i and material j from material i's side. In the Fresnel Equations, j is assumed for simplicity to always be i+1.

Also, $\tilde{n}=n-ik$, where n is the index of refraction, and k is an extinction coefficient, which can be obtained from standard handbooks. Equation (6) assumes that the permeabilities of all the materials are equal, and cancel from the relations. For example, this is possible when the materials are dielectrics, semiconductors, or most non-ferrous metals. Furthermore, normal incidence is assumed, so that all of the cos θ terms are 1. These assumptions have the added effect of making the equations for the electromagnetic waves, parallel and perpendicular to the plane of incidence, identical.

The material system of FIG. 1 has been simulated using a written computer code following the outlines above. Specifically, materials one and three 11, 18 are considered to be a vacuum, n=1 and k=0, while material two 12 was assumed to be SiO, InAs, and Pt. All calculations were done assuming that the incident radiation was of a monochromatic wavelength of 4 μm. Since n is a function of λ, all the following reported values for n are for λ=4 μm. SiO has an index of refraction equal to 1.816. InAs has a complex index of refraction of 3.534-i0.013. Finally, Pt has a complex index of refraction of 3.7-i14.9.

Figure 3:
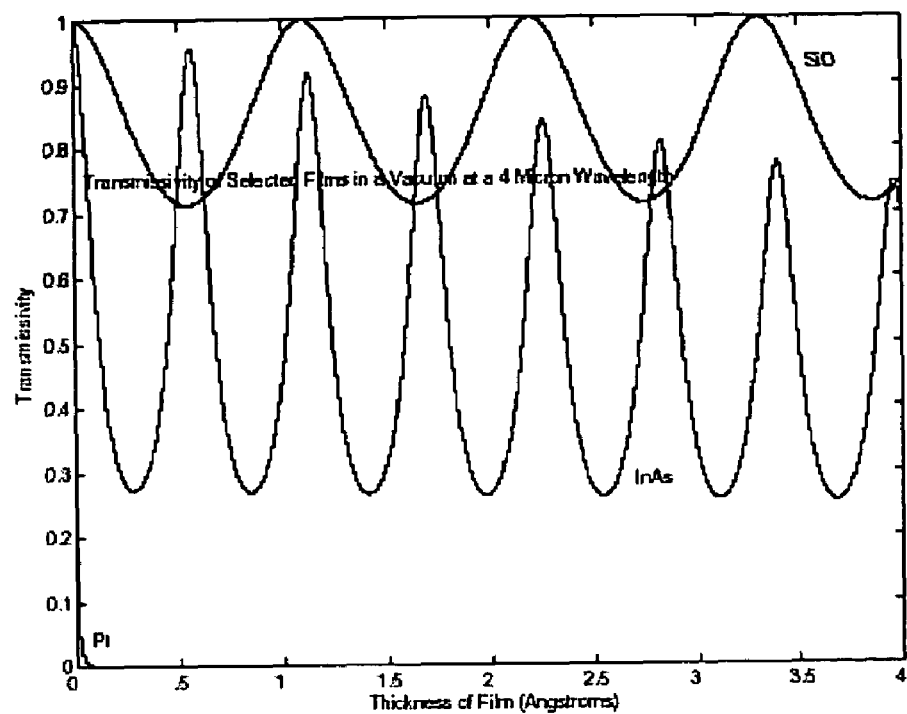
FIG. 3 is a plot of transmissivity versus increasing film thickness at 4 μm for SiO, InAs, and Pt films.

FIG. 3 shows a plot of the transmissivity of these three different materials, relating the transmissivity to the thickness of each film in microns. SiO was chosen to illustrate the effect of a material with an extinction coefficient equal to zero (k=0) resulting in a transmissivity that exhibits undamped sinusoidal oscillations with increasing film thickness. InAs was chosen in this example because it has a relatively small extinction coefficient, k=0.013, causing the transmission to slowly damp out the oscillations from the interference effects. Pt was chosen because its large extinction coefficient (k=14.9) eliminates the interference effects of the film. Using the appropriate values of n and k, any material can be modeled using this approach. As such, the method is not limited to any specific type of material, and is generally applicable to any and all materials.

Figure 4:
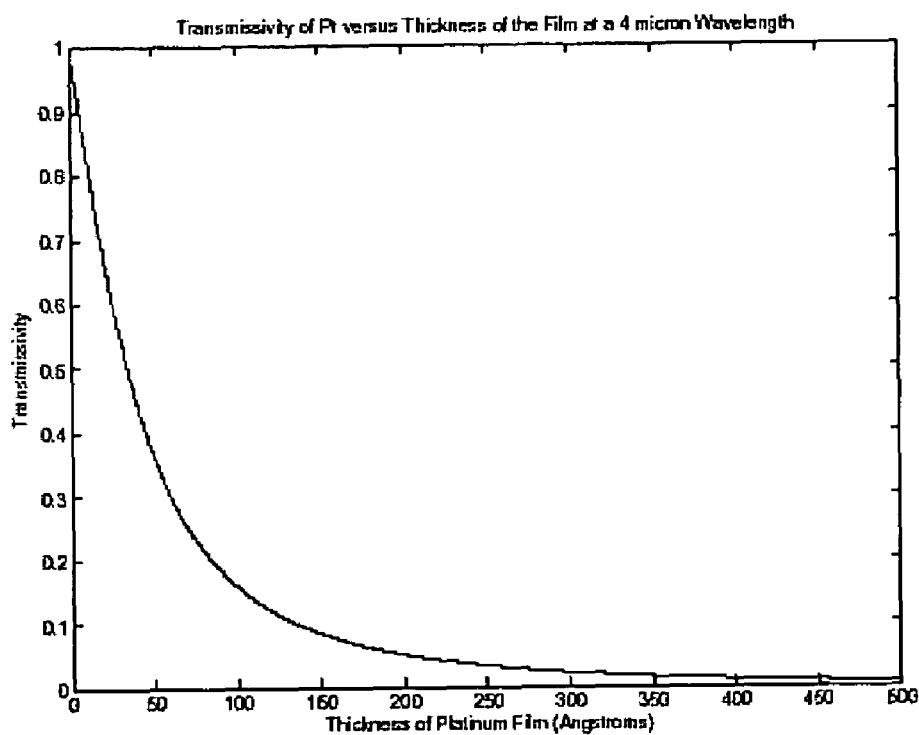
FIG. 4 is a plot showing transmissivity versus increasing film thickness at for a 4 μm incident wavelength passing through a platinum film.

Referring now to FIG. 4, highlighting Pt, the Pt curve shows a rapid decay of the transmissivity as thickness of the Pt increases. Specifically, the transmissivity drops from 1 to 0.1 in less than 150 Angstroms of material thickness. Some areas of the Pt curve, in fact, show a >10% change in the transmissivity for a 1 Angstrom change in Pt thickness. These thicknesses correspond to those that would be typically deposited, for example, for a metal in a micro-fabrication process. At a sufficiently large thickness, for example 100 Angstroms, the material may become opaque to the electromagnetic waves. Thus, while the materials do not transmit IR in bulk dimensions, as thin films they transmit IR. The transmissivity goes through a full range of values, between 1 and 0, during deposition to the critical thickness, providing an entirely novel approach to measuring the film thickness with unprecendented levels of thickness resolution.

The change in transmissivity of other material systems' curves can also yield strong functions of thickness, especially for materials with a relatively large extinction coefficient. However, the change of transmissivity will likely not be as sensitive as that of materials having a relatively large extinction coefficient, such as Pt.

An exemplary method exploits the significant transmissivity drop for a small thickness of metal deposited onto an Si wafer. Because Si does not have an extinction coefficient in the infrared (IR) range, it passes a relatively large amount of the 4 μm wavelength electromagnetic radiation chosen to illuminate the samples. At shorter wavelengths, such as the near IR and shorter, Si does have an extinction coefficient.

A series of experiments were conducted using IR radiation to measure the thickness of metal films deposited on Si substrates, polymer films on plastic substrates, and polymer films on metal substrates. Experiments were conducted both ex-situ and in-situ.

The first example was for the deposition of a gold (Au) film on a 505 μm thick Si wafer. Transmissivity data was collected using a commercially available IR imaging system, such as a Delta Therm infrared camera, manufactured by Stress Photonics of Madison, Wis. Samples were illuminated in air using a Xe lamp through the uncoated side (backside) of the Si wafer. The illuminating IR passes through the wafer, through the Au layer, then through the air to the IR camera. In a preferred embodiment, to improve resolution, the radiated energy was modulated using an interrupter embodied in an energy-blocking surface such as a chopping blade, which periodically interrupts the radiated energy. This modulation is synchronized with images taken by the camera. Three different Si substrates were coated with nominal Au-layer thicknesses of 70, 100, and 160 Angstroms, respectively. IR transmission intensities were normalized by measuring the IR transmissivity through an uncoated portion of the Si substrate. Transmissivities of the coated samples were then normalized by dividing their intensities by the intensity of the uncoated substrate.

Figure 5:
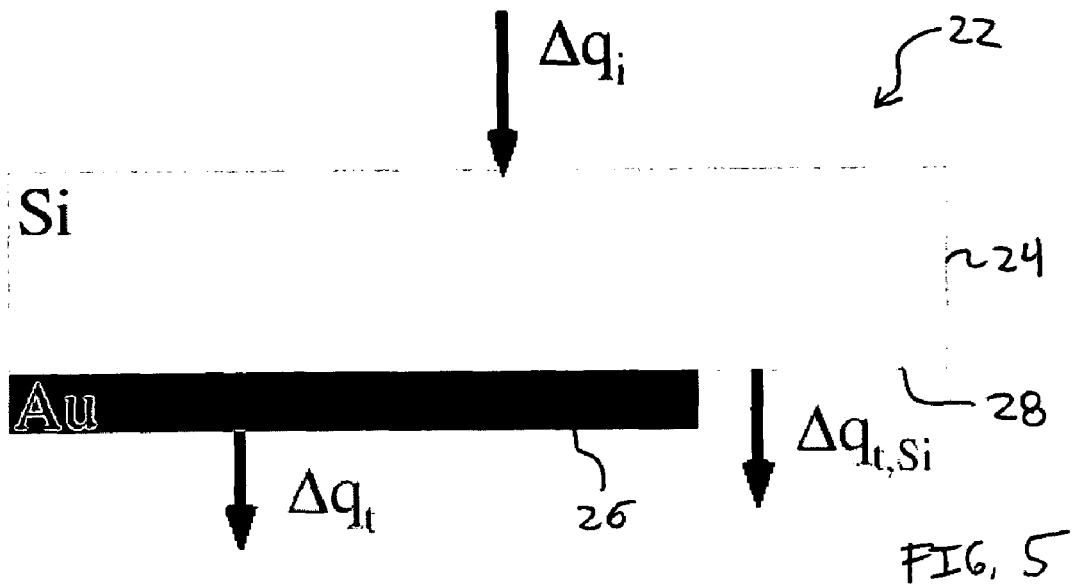
FIG. 5 shows electromagnetic wave fluxes entering and leaving a four material system.

The relative or normalized transmissivity is defined as the flux transmitted through the system divided by the flux transmitted through the uncoated Si (without the Au). All the data necessary to obtain the relative transmissivity experimentally were contained in each sample. This was accomplished by masking part of the wafer from deposition, resulting in a sample, shown in FIG. 5. The sample includes a silicon substrate 24, a gold film 26, and an uncovered portion 28 of the silicon substrate. As shown in the sample of FIG. 5, relative transmissivity is given by:

$$\tau = \frac{\frac{\Delta q_t}{\Delta q_i}}{\frac{\Delta q_{t,S_i}}{\Delta q_i}} = \frac{\Delta q_t}{\Delta q_{t,S_i}} \quad (7)$$

In equation (7), $\Delta q_t$, $s_i$ is the flux transmitted through the uncovered Si 28. As stated in equation (1), $$\tau = \frac{\Delta q_t}{\Delta q_i}.$$

This relative transmissivity maintains the property of the transmissivity in that its value must also range between 1 and 0. FIG. 5 schematically represents the light entering and passing through the system, where internal and secondary reflected/transmitted waves have been omitted for clarity. For this model, the air of the experiment was assumed to have a refractive index of 1.

The model is also easily modified to report the relative transmissivity for in-situ measurements. This can be accomplished by, for example, dividing the output for the vacuum/Si/Au/vacuum system by its initial value where the thickness of the Au layer is zero.

Figure 6:
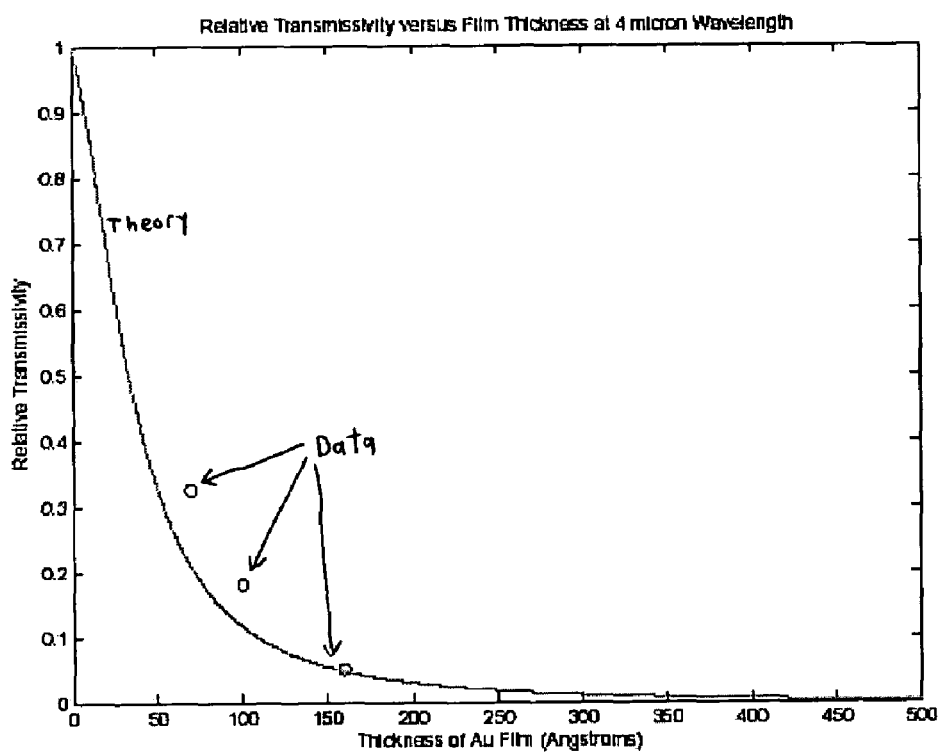
FIG. 6 is a plot of the relative transmission for a gold film of variable thickness on a silicon substrate produced according to a method of the present invention.

The value of the complex index of refraction for Au is 2.6-i24.6 for a monochromatic wavelength of 4 μm. FIG. 6 compares the experimental results for gold-coated Si with theoretical expectations, showing good agreement between the theoretical predictions of the relative transmissivity and the experimentally measured values.

Because a diffuse unfiltered electromagnetic wave source was utilized for the experiment, better agreement may be possible. A 4 μm wavelength was chosen to model this data because the IR camera used in the experiments is sensitive over a wide range of wavelengths whose average is roughly 4 μm.

The method can also be used to determine deposition thickness in-situ. An exemplary apparatus 30, shown in FIG. 7, includes a deposition chamber 32, particularly a Veeco Series 400 Evaporator, in which a sapphire viewing window 34 is provided for an IR camera 35, and to allow the transmission of light 36 through a sample including a substrate 38 and film 40. In an exemplary embodiment, a hole was cut into a baseplate of the deposition chamber 32, and a flange with the sapphire window 34 was installed. The sapphire window 34 was used because the electromagnetic wavelength for the experiments was approximately equal to 4 μm, and sapphire passes a large amount of electromagnetic radiation at this wavelength. An adjustable stand mounts the substrate 38 on which the material 40 is deposited.

To improve the signal-to-noise ratio for in-situ measurements, a "chopped" light source 42 such as an IR source was used to illuminate the sample. An exemplary interrupter (not shown) to chop the light source includes a motor, an interrupter for the radiated energy in the form of an energy-blocking surface such as a chopping blade, and Variac to control the speed of the motor. The blade is disposed between the light source 42 and the sample (the substrate 38 and film 40) to interrupt the electromagnetic radiation transmitting through the sample and produce a chopped signal 44. The sample may be positioned on a suitable stand (not shown). A signal conditioner/one-shot system 46 was built to synchronize the interrupter and the IR camera 35.

Figure 7:
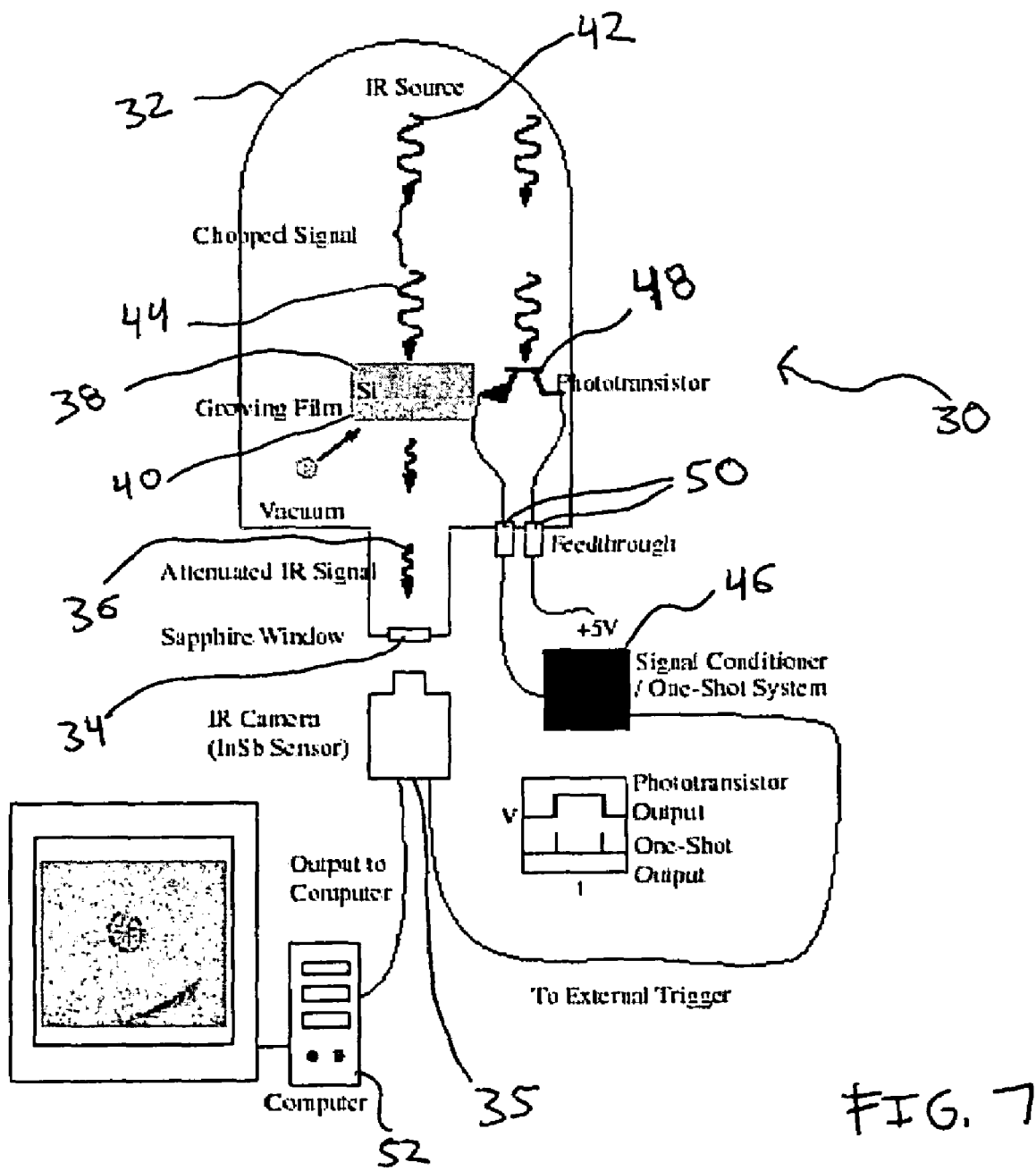
FIG. 7 is a schematic of an apparatus for measuring in-situ thickness of a film, according to an embodiment of the present invention.

As shown in the exemplary system of FIG. 7, the light source 42 illuminates the silicon substrate 38 with radiation, which is transmitted through the evaporated film 40, then through the sapphire window 34, to the camera 35. The IR radiation is chopped above the sample by the chopping blade. Next to the sample is a detector, in this embodiment a phototransistor 48, which detects the chopped light 44. That is, it detects when the radiated energy is allowed to transmit and when it is not. The output of the phototransistor 48 is then passed through feedthrough connections 50 to the signal conditioner/one-shot system 46, which triggers the camera 35 to capture images both when there is light present, and when the IR radiation has been blocked, respectively. This provides pairs of images, which are then sent to a processor, such as a computer 52, for processing.

In the embodiment shown in FIG. 7, for example, there is a significant amount of electromagnetic radiation present in the chamber 32 while the material is being deposited. In the in-situ experiment, direct evaporation of metal is performed using a resistive element (a W boat, not shown). A large current is passed through the W boat, heating the boat (Joule heating). The material to be deposited passes from a solid phase to a gas phase by either liquidation followed by evaporation or by sublimation.

The amount of energy that is emitted during this process is considerable and not constant. Phase changes are constantly happening, causing different amounts of heat to be absorbed by the material, and thereby affecting the amount of energy radiated from the W boat. Also, the material is continually evaporating and therefore its mass in the boat is decreasing, changing the heat transfer characteristics in a different way. An average change is assumed to happen over a relatively long period, for example, on the order of a few seconds, because of the low deposition rates typically used in processing. Therefore, by capturing images synchronized to the chopped IR, one can effectively filter out any and all of these effects.

Figure 8:
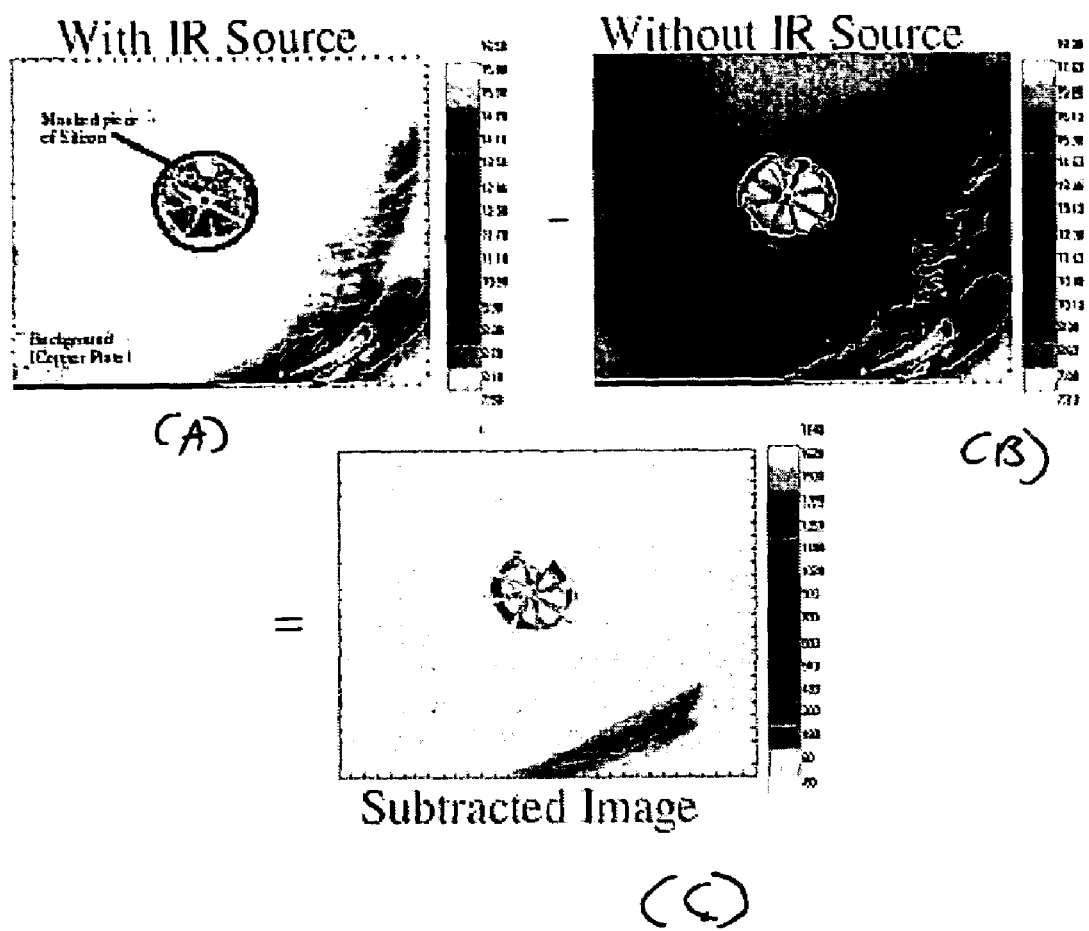
FIGS. 8A-8C are images taken through a sample with an infrared source, without an infrared source, and a subtracted image, respectively.

In a preferred method of filtering, an image is taken with and without energy from the known IR source 42. The image taken without the energy is subtracted from the image taken with the energy. Signal-to-noise ratios are improved by subtracting the "dark" image (the image when the light is not present) from the "light" image (the IR-illuminated image) of the sample. FIGS. 8A-8C demonstrate this subtraction method on two such images (FIGS. 8A, 8B), providing a third, subtracted image (FIG. 8C). FIGS. 8A-8C show images of a masked piece of silicon against a copper plate background. As shown, the area around the Si sample has a value of approximately zero in the subtracted image.

The filtered signal is the transmitted flux, $\Delta q_t$, for the system. The first data point, however, is actually $\Delta q_t$, $S_i$, that is, the image of the system prior to deposition. Therefore, all images are divided by this first data point to obtain the relative transmissivity. This is an alternative method to using the masked substrate 22 shown in FIG. 5. The subtracted image shown in FIG. 8C, preferably a full-field image, can then be used to determine the thickness of the film 40 using the relative transmissivity by relating the image to the thickness of the film, preferably in a manner similar to that described above.

Figure 9:
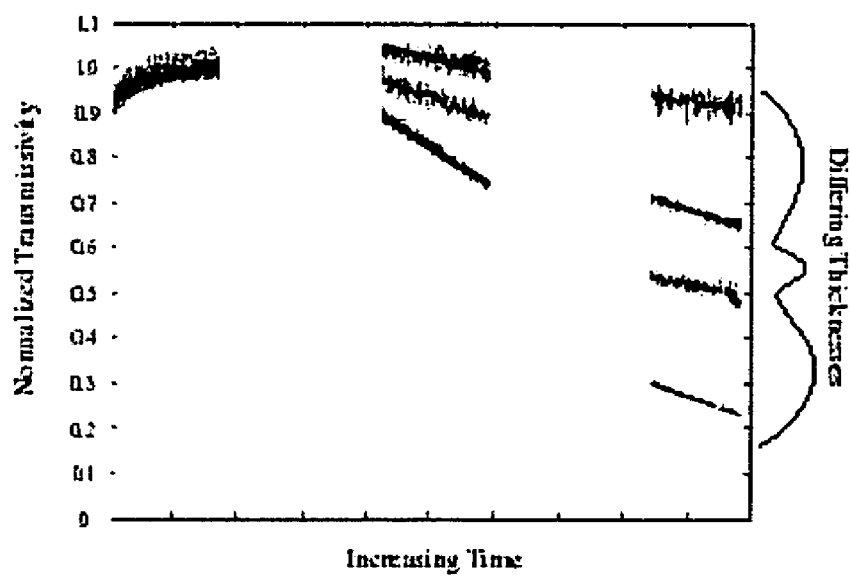
FIG. 9 is a plot of normalized transmissivity versus increasing time for a thin Al film deposited on a Si substrate entirely enclosed within a vacuum.

Taking the normalized transmissivity from individual pixels, a plot of normalized transmissivity versus deposition time for deposition of a thin Al film was found and is shown in FIG. 9. FIG. 9 is a plot of the real-time normalized transmissivity versus increasing time for a thin Al film deposited onto an Si substrate. One pixel in the images taken from the IR camera in this experiment corresponds to an area on the sample of approximately 350 μm by 350 μm. Four different experiments were conducted each with different deposition rates, and four different relative transmissivities were found.

Figure 10:
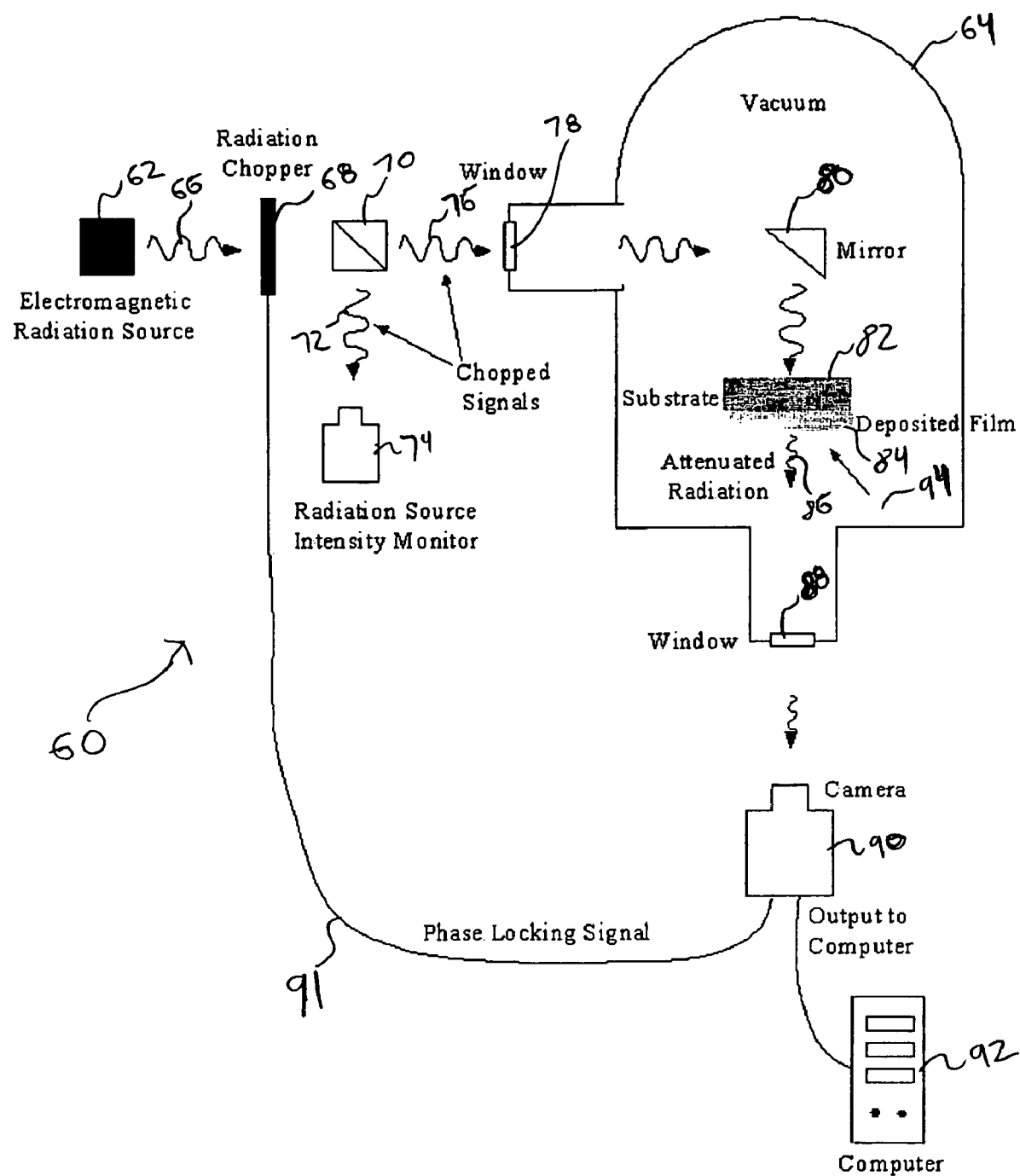
FIG. 10 is a schematic of a generalized system for measuring deposition thickness in-situ, according to an embodiment of the present invention.

FIG. 10 shows another apparatus 60 for measuring deposition thickness integrated into a deposition system. The apparatus 60 includes an electromagnetic radiation source 62, which in an exemplary embodiment is disposed outside of a deposition chamber 64. The electromagnetic radiation source 62 emits radiation 66 at a desired frequency and intensity into an interrupter, such as a radiation chopper 68. The chopper 68 interrupts the emitted radiation 66 at a given time interval. Emitted radiation (when it is not interrupted) is sent through a beam splitter 70, which sends part 72 of the radiation to a radiation source intensity monitor 74 and another part 76 of the radiation into the chamber 64 through a light path, such as a transmissive window 78.

In a preferred embodiment, it is beneficial to monitor the source radiation 66 using the radiation source intensity monitor 74 to verify that the electromagnetic radiation source 62 is continually emitting radiation of a constant intensity (though it is interrupted by the chopper 68). Because measurements from the apparatus 60 are preferably normalized to a set of initial readings, the intensity of the electromagnetic radiation should remain fairly constant. Otherwise, any difference in the radiated energy should be accounted for to produce accurate results.

The remaining radiation 76 entering the vacuum chamber 64 through the window 78 bounces off a mirror 80, and then passes through a substrate 82 and then through the deposited material 84 (a film). The transmitted radiation will always be less than or equal to the input radiation, but most often the radiation will be attenuated. This transmitted radiation 86 passes through a light path 88 (such as another window) to exit the chamber 64 and it is picked up by a camera 90. Alternatively, there may be only one light path; that is, the same window in some embodiments may be used for ingress and egress of radiation.

The camera 90 is phase-locked with the chopper 68 (for example, via conductive path 91) for processing of the images, so that pairs of images are taken as described above. It is also preferred that the camera 90 is operatively connected to a processor, such as a computer 92, for processing of the images. This computer 92 also can be linked to the deposition equipment (not shown) to control the deposition process, for example by monitoring deposition thickness and halting or altering the deposition of a material 94 when a desired thickness has been reached.

Additional experiments were conducted by evaporating a thin gold film onto 1 mm thick silicon wafer substrates. The evaporator was a BOC Edwards Auto 301 Evaporator, with the deposition chamber pressure and specimen temperature being an average of $10^{-7}$ Torr and 72 F respectively. The gold thin films were deposited at a rate of approximately 1 Ångstrom/second, and ranged in thickness from 70-250 Ångstroms, as monitored by a calibrated quartz crystal monitor in the evaporation chamber. A portion of the wafer was uncoated for later reference.

The testing setup for the Si wafer/Au thin film specimen employed an 80007 Silicon Carbide Infrared Source from Oriel instruments, emitting a collimated beam with a maximum divergence of 1°. This was directed at the back of the silicon wafer substrate, and a Delta Therm 1550 infrared camera was focused on the front surface of the specimen. A two-position zoom lens was used to achieve a high spatial resolution of the infrared measurements.

Although the transmission of infrared through these specimens is not dependent on a varied frequency of the heating source, a modulated source was preferred to obtain the high resolution capable with this camera system. The same chopper used for the previously described Au—Si experiment was used for this configuration. The camera was synchronized with the chopped beam, so that images were taken when the beam was not interrupted.

Figure 11:
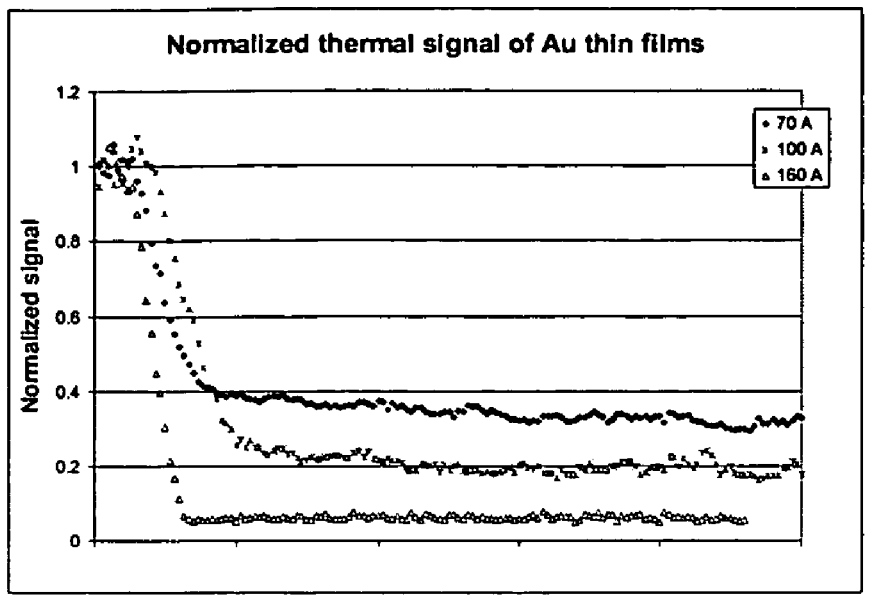
FIG. 11 is a plot of normalized thermal signal profiles from Au thin film specimens.

Line scans of the absolute thermal signal were taken from each of the silicon wafer/gold thin film data images, and scaled by the average thermal signal from the uncoated portion of the wafer. This resulted in a relative measurement of the intensity as dependent only on the thickness of the gold thin film. The normalized thermal signal line scans for several different film thickness levels are shown in FIG. 11.

Figure 12:
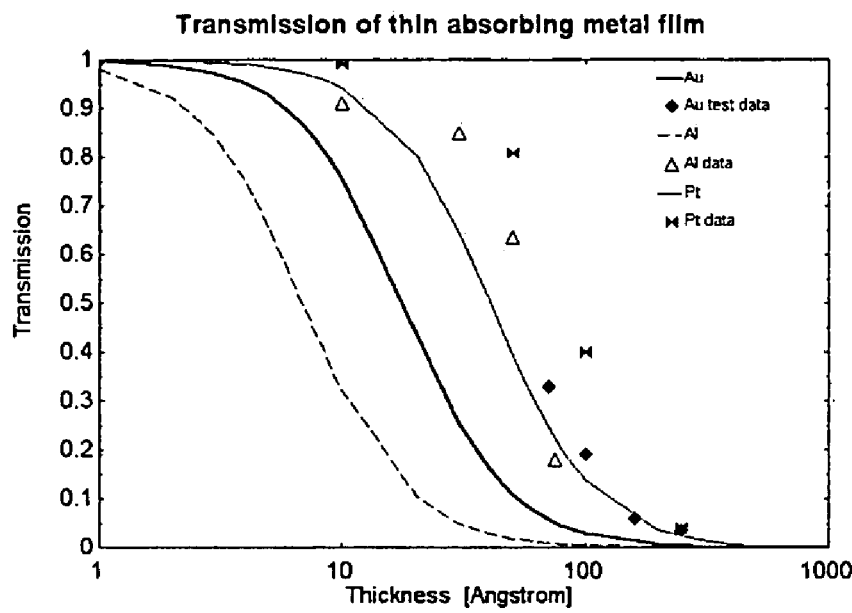
FIG. 12 shows modeled and experimental transmission of normally incident mid-infrared (3-5 μm) radiation through various metal thin films.

FIG. 12 shows the anticipated fraction of infrared intensity transmitted through various thin metal films at an average wavelength of 4 μm from normally incident radiation. This predicted response is calculated from elaborations on Equation (2). The values of the absorption constant, k, used for the predicted response were taken from Palik, *Handbook of Optical Constants of Solids*, Academic Press, San Diego, 1998. As the films are highly absorbent, interference fringes are not seen.

Also shown in FIG. 12 is the experimental data from this testing of gold thin films, and other experimental data compiled by Moses, *Handbook of Electronic Materials*, Vol. 1: Optical Material Properties, 1967, of transmittance through thin metal films. It can be seen that the experimental data do not exactly correspond with the predicted response, but are offset from each of their respective curves by a similar amount. However, each experimental data set is well described by an exponential fit, and from this fit, the experimental absorption constant can be back-calculated, and has been found to differ from tabulated values by approximately a factor of 2. Factors that should be considered in light of this discrepancy in absorption constants are that thin film optical constants are known to vary given different deposition methods and substrate materials, and that this testing did not occur in a controlled vacuum immediately after deposition, possibly allowing the formation of a surface oxide or contaminant layer.

In addition to measuring coatings and thin metal films, the thickness of other materials could be measured by selecting an appropriate frequency of oscillated heating, or a wavelength range over which the material to be measured is absorbent. Additionally, a substrate material is not required, as the conductive method only requires a subsurface oscillated heating, and the transmission method only requires knowledge of the source intensity. As such, the method can be applied readily for measuring the thickness of freestanding films.

In experiments according to a fourth embodiment of the present invention, heat was transmitted through a film by thermoelastic heating of the substrate below a deposited material and the resulting thermoelastic heat energy was received by an infrared camera. A non-reflective black paint coating was applied to a steel sample, at varying coating thicknesses. The steel sample was mechanically loaded using a cyclic stress input, generating an adiabatic, reversible thermoelastic temperature change in the steel. Since the steel is a much better thermal emitter than the paint, heat from the steel conducts through the paint coating. The coating causes an attenuation and phase shift of the thermal signal that conducts through it, the amount of which depends upon the coating thickness, the coating properties, and the testing frequency. The effect that a paint coating has upon the thermal signal conducted from a substrate has previously been modeled. The present method provides a practical implementation of these models.

The signal attenuation through a coating may be modeled as follows:

$$\frac{T_o}{T_i} = \left| \frac{1}{\cosh\left[t_c \sqrt{\left(\frac{\omega}{2\chi}\right) * (1+i)}\right]} \right| \quad (7)$$

where $\omega$ is the test frequency, $\chi$ is the thermal diffusivity of the coating, and $t_c$ is the coating thickness. The phase lag of the surface temperature amplitude with respect to the testing frequency is described by the angle associated with this relation. This model does not account for the thermoelastic response of the paint coating, however.

Another model considers heat transfer through the coating in terms of thermal radiation waves that are both absorbed and reflected as they travel from the substrate through the interface and to the coating surface. Mackenzie, "Effect of surface coatings on infra-red measurements of thermoelastic responses", *Stress and Vibration: Recent Developments in Industrial Measurement and Analysis*, SPIE Vol. 1084, pp. 59-71, 1989, describes this situation of heat transfer through the coating in terms of thermal waves that are both absorbed and reflected as they travel from the substrate through the interface and to the coating surface. This model accounts for the thermoelastic response of the coating as well as the thermal lag that is caused.

As thermoelastic stress analysis often involves the comparison of the stress fields in different areas, the effects that a varied paint thickness could have are of concern. For this reason, models have been developed to attempt to quantify the effects. However, these models, in combination with the accuracy of the infrared temperature camera, can also be used to determine the paint thickness.

Figure 13:
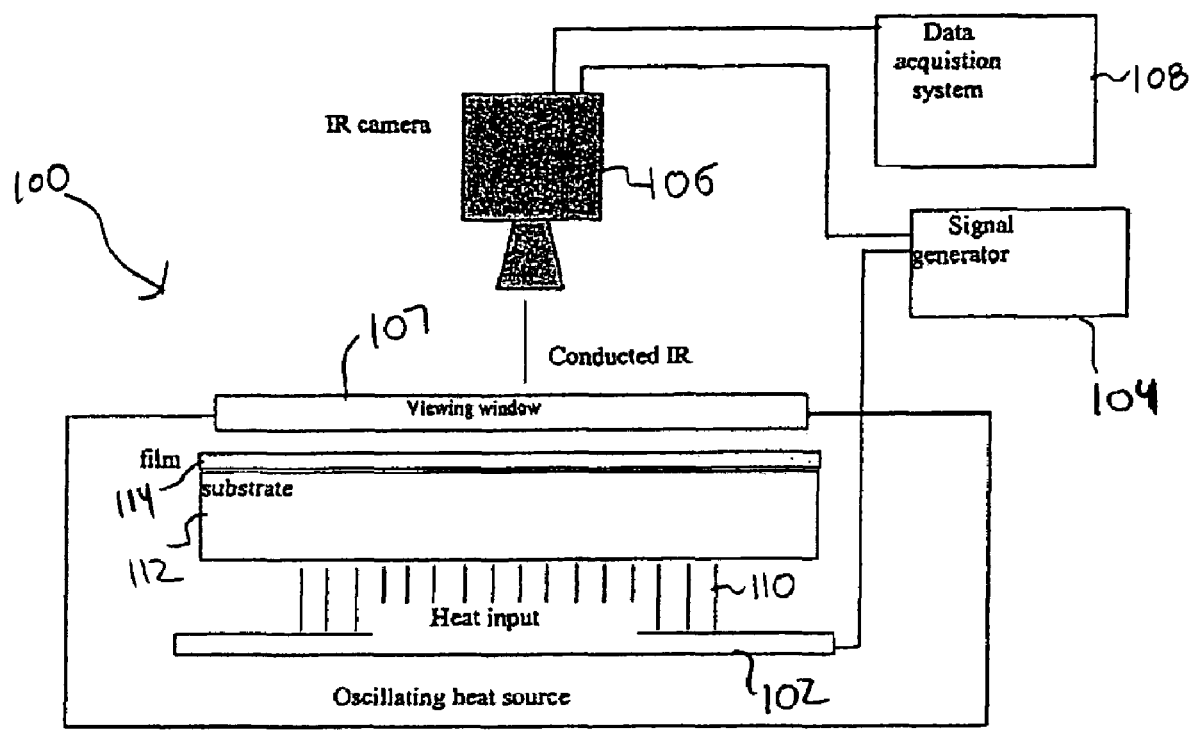
FIG. 13 shows another system for determining thickness of a deposition material according to another embodiment of the present invention.

An exemplary system 100 to perform a method according to the fourth embodiment of the present invention is shown in FIG. 13. The system 100 includes a controllable oscillating heat source 102 or a mechanical driving force driven by a signal generator 104, and an apparatus for receiving the energy, which in an exemplary embodiment is an AC infrared camera 106, which is positioned to view through a window 107. The camera 106 is operatively coupled to a data acquisition system 108 for receiving and processing the images generated from the camera. The camera 106 is phase-lock-looped into the frequency of the heat source 102.

According to a preferred method, the energy radiating source 102 applies oscillating heat 110 to the backside of a substrate 112 or generated in the substrate using mechanical excitation based upon the thermoelastic effect. The heat conducts through the substrate 112 in a characteristic time, then into and across a coating of deposited material 114. The time required to conduct through the coating 114 will depend upon the thermal properties of the coating and the coating thickness. One the thermal properties are established, the system 100 can be calibrated to directly measure the thickness of the coating 114. A preferred embodiment of the system 100 currently has a spatial resolution of 20 microns and a thickness resolution dependent upon the thermal properties of the layer.

In an experiment, two specimens were prepared. The paint coating was Krylon Ultra Flat Black spray paint. The specimens were steel bars with a width of 31.7 mm and a thickness of 9.4 mm. Steel was chosen for the substrate as it is magnetic, and a simple magnetic paint thickness gauge could then be used for a quick check of the approximate paint thickness.

Both of the bars were coated with the paint in layers, with the necessary amount of time for the paint to dry between layers. Care was taken so that the specimen did not have any interfacial materials between the coating layers. The bars were flat to minimize variance of the coating thickness of the paint.

To obtain a very accurate measurement of the paint thickness, initial profile measurements were made on one of the bars before painting. A portion of this bar was left uncoated for reference in later thickness measurements. As the profile was found not to vary by much, it was not taken on both of the bars, but merely served as a measurement of the average roughness. Profile measurements were then taken of the bars when the testing was completed to determine exactly what the paint thickness was. The range of the paint thickness was from 21 to 149 micrometers.

The specimens were cyclically loaded using a MTS servo-hydraulic load frame, controlled by a signal generator, which in this experiment was an Instron 8500 Plus controller. The camera, a Delta Therm 1000 infrared imaging system, obtained the temperature mappings of the specimen. The main differences between the Delta Therm 1000 and 1550 is that the 1550 has a closed cycle cooling system and a larger array of infrared detectors. Both are sensitive to infrared in the wavelength of 3-5 µm.

A sinusoidal load of 1780-8900 N (400-2000 lb.) was applied, creating a stress of 6.0-29.9 MPa. The specimens were tested at frequencies ranging from 3-50 Hz.

In this embodiment, models involve the thermal properties of the coating in determining the response. As the thermal diffusivity, conductivity, and other paint properties were not readily available, work was done to model the coating as a particulate composite. This serves to obtain a prediction of what will be expected experimentally.

Thermal images of the absolute thermal response of the painted bars were produced. For measuring the attenuation of the response, the thermal response for the various coating thickness was scaled by the magnitude of the maximum response. The maximum response was determined by the consideration that at low testing frequencies and the minimum thickness, the response observed should be attenuated very little. An estimate of the maximum response was also determined by the examination of the non-coated portion of the steel bar and the knowledge of the approximate emissivity of steel. These values were approximately equal, and were used to scale the response and determine the attenuation.

Figure 14:
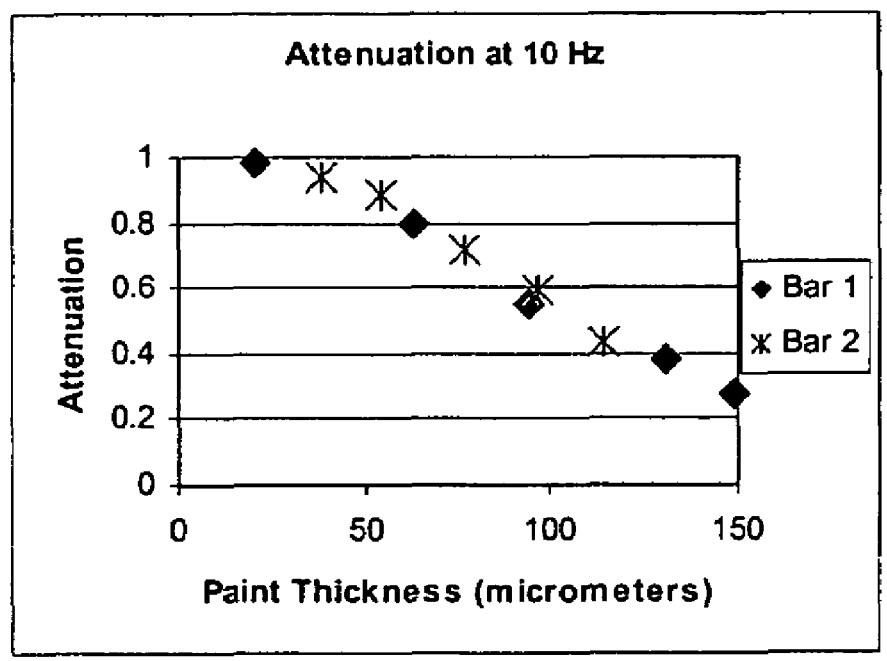
FIG. 14 is a plot of attenuation of painted bars versus paint thickness at 10 Hz.

The attenuated response of the two test pieces is shown versus the paint thickness at a frequency of 10 Hz in FIG. 14.

Figure 15:
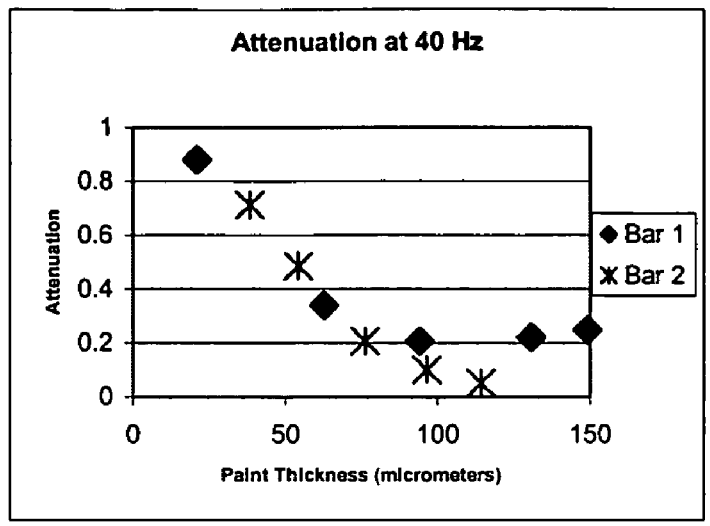
FIG. 15 is a plot of attenuation of painted bars versus paint thickness at 40 Hz.

It can be seen that the response of the two bars is very similar. This was observed at the low frequency/thin paint combinations. However, the attenuation was found to differ at the high frequencies/thick paint testing conditions, as shown in FIG. 15. It is hypothesized that the differences between the two painted bars exist at the high frequency/thick paint combinations due to the difference in the paint quality of the two bars. Bar 1 was painted very uniformly and even, while bar 2 was more speckled and uneven. At the high frequency levels, the response is mainly due to the thermoelastic response of the paint, and if the coating was non-uniform and contained porosity, the thermoelastic response would not be as great.

Figure 16:
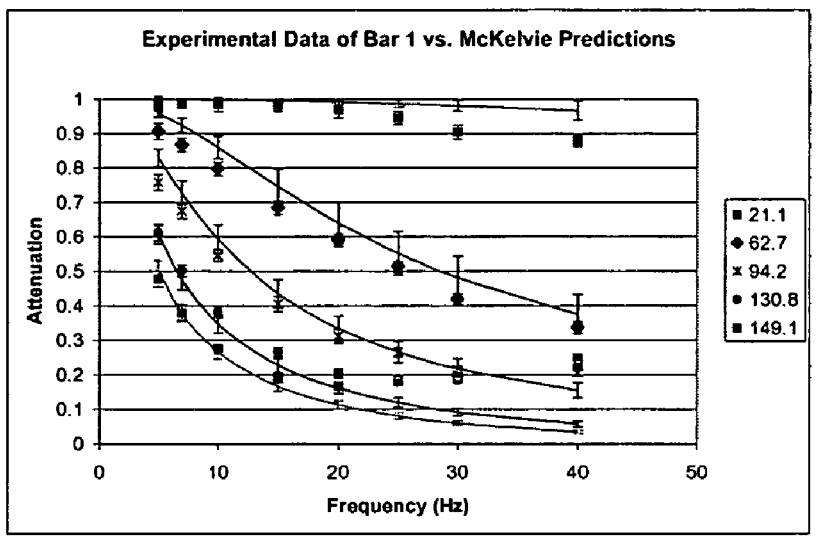
FIG. 16 shows plots of attenuation of the Bar 1 of FIGS. 14 and 15 at various coating thicknesses compared with theoretical predictions.

The experimental attenuation data was first compared to the simple model by McKelvie, Consideration of the surface temperature response to cyclic thermoelastic heat generation", *Stress Analysis by Thermoelastic Techniques*, SPIE Vol. 731, pp. 44-54, 1987. Within this model, the only parameter that would be used to fit the data is that of the thermal diffusivity. The attenuation of bar 1 is compared with the McKelvie model in FIG. 16.

Figure 17:
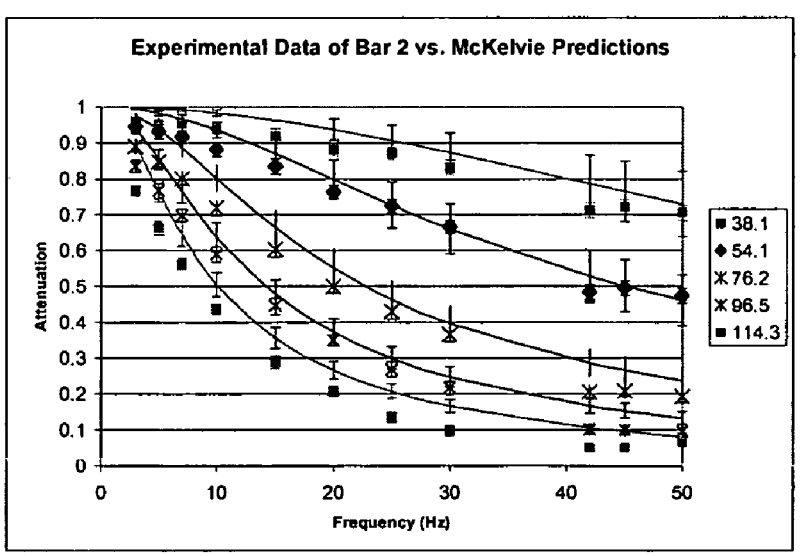
FIG. 17 shows plots of attenuation of the Bar 2 of FIGS. 14 and 15 at various coating thicknesses compared with theoretical predictions.

The paint thermal diffusivity that is used to fit the data of bar 1 is $1.7*10^-7$ $m^2/s$. This is the only fitting parameter used. In comparison to this experimentally determined diffusivity, the predictions by modeling the paint as a particulate composite determined the diffusivity to be between 1.7-2.1 $m^2/s$. The error bars of the predicted response correspond with the uncertainty in the paint thickness measurements of ±5 micrometers. The error bars of the experimental response are the variation of the signal intensity for the specific paint thickness. It can be seen that this model does not fit the data well at high frequency/thick paint combinations because it does not account for the amplitude of the response that is due to the paint thermoelasticity. FIG. 17 shows the experimental response of bar 2 compared with the McKelvie model.

The thermal diffusivity used to fit the experimental data of bar 2 was $2.1*10^-7$ $m^2/s$. The reasons for the difference in this value from that of bar 1 are probably also due to differences in paint quality, as was explained for FIG. 15. With the paint quality of bar 2 being slightly uneven and porous, the thermal diffusivity would be affected as well. The error bars are due to the same sources of error as those of FIG. 16.

Figure 18:
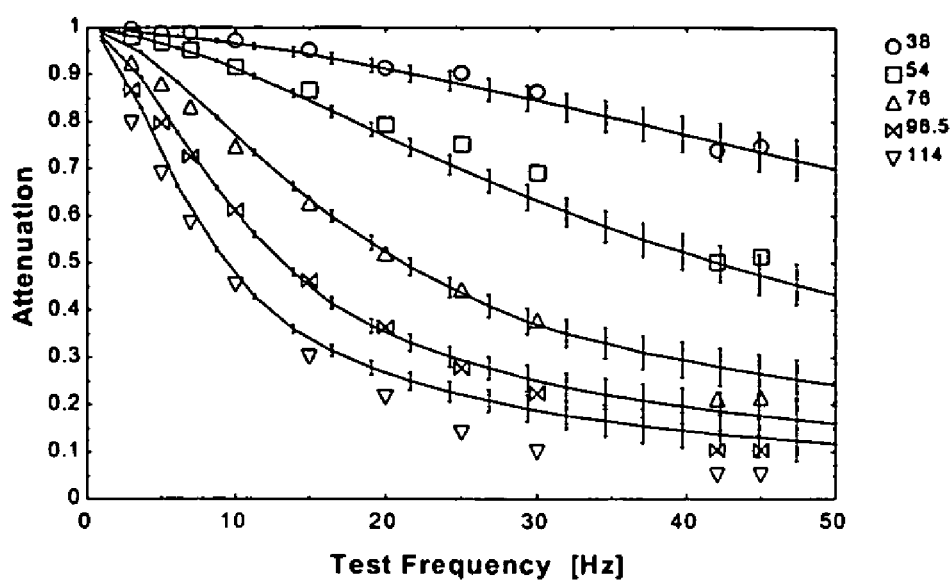
FIG. 18 shows plots of experimental attenuation of the Bar 2 of FIGS. 14 and 15 versus model predictions.

The attenuation data was also fit with the Mackenzie model, which includes the thermoelastic response of the coating. This model is shown fit to the experimental data in FIG. 18. It can be seen that the Mackenzie model also fits the attenuation data very well. The data of bar 1 was also fit well by this model.

In another exemplary experiment, polymer plaques were painted with several steps of increasing thickness of Krylon® Ultra Flat Black (KUFB) spray paint. Two polymers were used: polymethylmethacrylate (PMMA), and Delrin®, a DuPont acetal resin. The steps of increasing thickness were created by evenly spraying the entire specimen on one side, allowing for an appropriate drying time, and then shielding a portion of the specimen, and spraying the remainder of it again. This process was repeated to create several steps of increasing paint thickness, each time shielding an increasing length of the specimen.

A Mitutoyo Contracer CBH-400 profilometer was used to measure the coating thickness to within ±4 µm. These measurements were made after testing was completed to ensure that the coating surface was not damaged. The thickness of the KUFB coating steps ranged from 15-71 um.

Figure 19:
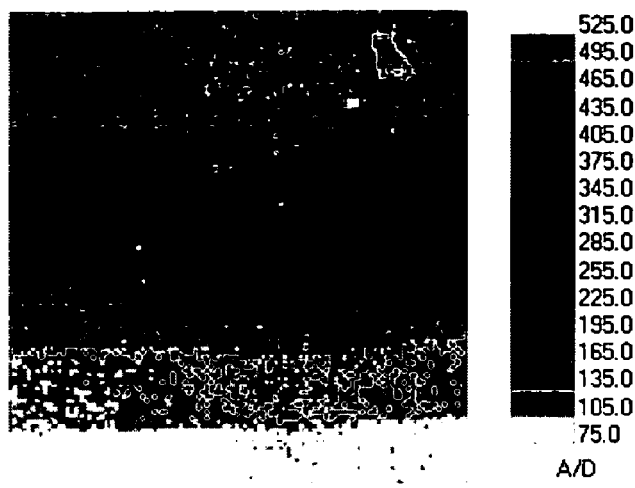
FIG. 19 shows an absolute thermal signal of a polymethylmethacrylate (PMMA) substrate with stepped Krylon® Ultra Flat Black (KUFB) spray paint.
Figure 20:
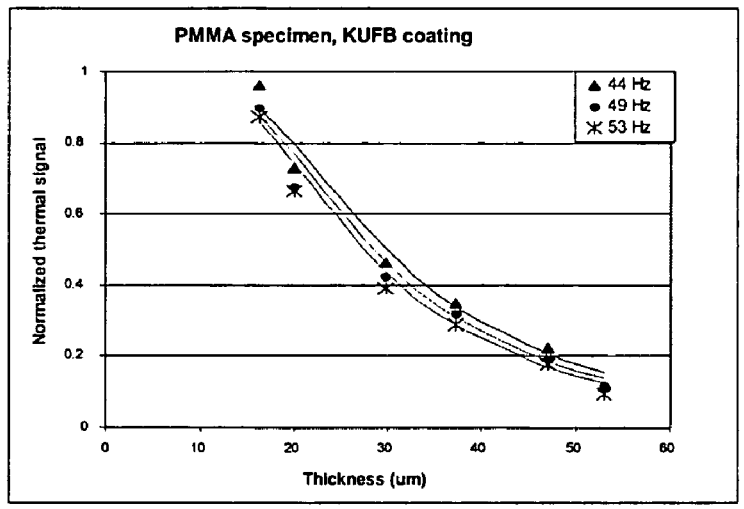
FIG. 20 is a plot of a normalized thermal signal versus thickness through a PMMA/KUFB specimen compared to a model.
Figure 21:
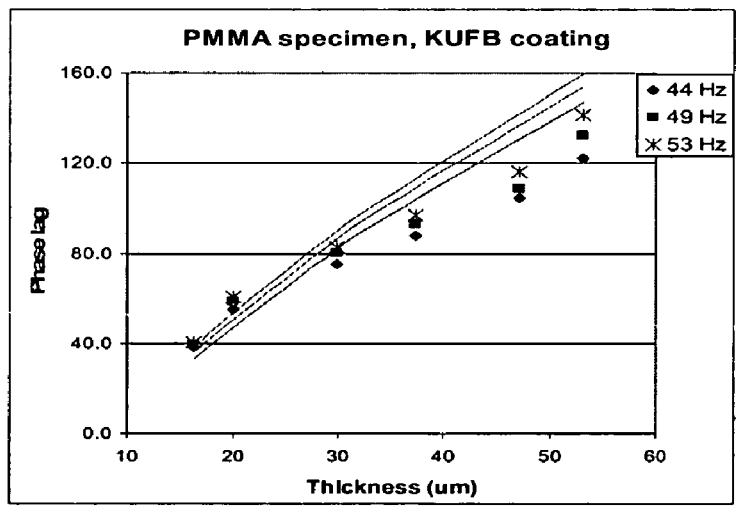
FIG. 21 is a plot of a phase signal versus thickness from a PMMA/KUFB specimen compared to a model.

A modulated heat source was created from an interrupter, embodied in a variable speed domestic fan, and a heating lamp. Alternatively, other modulated heat sources, such as flashing heat sources, are possible. The blade was removed from the fan, and replaced with a two-blade flat chopper, fabricated from cardboard. The interrupter modulated the radiative heating from a heat lamp mounted on one side of the interrupter. A test specimen was positioned parallel to the interrupter and opposite the heating source, in an insulated chamber with a black interior to minimize reflections. Infrared measurements were made with the Delta Therm 1000 infrared imaging system, manufactured by Stress Photonics of Madison, Wis., which is synchronized with the modulated heat source. The reference voltage signal necessary for high sensitivity measurements was obtained from a circuit containing a phototransistor, whose output was a variable voltage when exposed to light. The temperature within the chamber was also monitored to ensure that it was constant over the testing period. FIGS. 19 through 21 show a typical coated polymer sample, FIG. 19, and plots of the normalized signal, FIG. 20, and phase lag, FIG. 21, where phase lag is in degrees. These figures also show overlays of theory onto the experimental results, showing that the theory described previously can be used in polymer coated polymer substrate systems.

The determination of a thickness by the measurement of a received signal is possible by this invention. In principle, this could be done with any type of substrate, film, and/or coating. Also, though thin film metal deposited on a substrate is shown in particular embodiments, the inventive method is broadly applicable to a range of film, coating, and bulk materials.

Preferred methods provide the ability to increase yield and repeatability from IC manufacturers. Particularly, preferred methods allow IC manufacturers and researchers, for example, to make accurate measurements of material thicknesses in real-time throughout a deposition process, and process control based on determined thickness of deposited material. For example, in the semiconductor industry, improved metrology equipment is desirable to increase yield and lower production time. In-situ measurement of the thickness of films reduces or eliminates post-growth/deposition metrology time for devices. Combining such in-situ measurement with a closed-loop controller, for example, allows deposition of precise amounts of thin films to improve or maximize yield and increase repeatability. This can be done by, for example, allowing the controller to deposit for shorter or longer times to provide a maximum yield of devices for that step of the processing.

Another benefit is the ability to sense changes in a growth/deposition chamber. For example, if the target for a sputtering process was defective or nearing the end of its lifetime, the in-situ measuring system can detect this, as it would be sensed as a change in the uniformity of the deposited layer. While other methods have been confined to point measurements, a full-field, real-time imaging method of, for example, thin film deposition on silicon substrates at a high spatial resolution (in the micrometer range, for example) and a material thickness resolution on the order of Angstroms is provided by preferred embodiments of the present invention.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the invention are set forth in the appended claims.

What is claimed is:

1. A method for measuring a thickness of a deposited material, the method comprising:
   passing electromagnetic energy through the deposited material, wherein some of the energy is transmitted;
   receiving the transmitted energy;
   using the received energy, determining a thickness of the deposited material;
   wherein said determining comprises determining a transmissivity of the deposited material;
   wherein said determining a transmissivity comprises producing data from the received energy and associating the produced data with a thickness of the deposited material; wherein said determining a transmissivity further comprises filtering the produced data:
   wherein said passing energy comprises radiating energy and periodically interrupting the radiated energy;
   wherein said interrupting comprises cyclically introducing an energy-blocking surface between a source of the energy and the deposited material; and
   wherein said receiving the transmitted energy comprises receiving transmitted energy when the radiated energy is not interrupted and further comprising receiving energy when the radiated energy is interrupted.

2. The method of claim 1 further comprising:
   detecting when the radiated energy is interrupted and when it is uninterrupted;
   triggering a camera to capture an image alternately when detecting that the radiated energy is interrupted and when it is uninterrupted.

3. The method of claim 2 wherein said detecting uses a phototransistor, wherein said triggering comprises passing an output of the phototransistor through a signal conditioner/one-shot system that triggers the camera to capture an image.

4. The method of claim 2 wherein said triggering the camera is synchronized with said interrupting.

5. The method of claim 4 wherein said filtering comprises:
   for each pair of alternating images, subtracting the captured image taken when the radiated energy is interrupted from the captured image taken when the radiated energy is uninterrupted.

6. The method of claim 5 wherein said associating comprises:
   by pixels of the subtracted images, determining a transmissivity of the deposited material.

7. A method for measuring a thickness of a deposited material, the method comprising:
   passing electromagnetic energy through the deposited material, wherein some of the energy is transmitted;
   receiving the transmitted energy;
   using the received energy, determining a thickness of the deposited material;
   wherein said determining comprises determining a transmissivity of the deposited material;
   wherein said determining a transmissivity comprises producing data from the received energy and associating the produced data with a thickness of the deposited material;
   wherein said determining comprises:
   determining a normalized transmissivity of the deposited material.

8. The method of claim 7 wherein the material is deposited on a substrate, and wherein said determining a normalized transmissivity comprises:
   receiving the electromagnetic energy transmitted through the substrate, but not through the deposited material.

9. The method of claim 8 wherein said determining includes normalizing the received transmitted energy through the deposited material using the received transmitted energy through the substrate but not through the deposited material.

10. A method for measuring a thickness of a deposited material, the method comprising:
    passing electromagnetic energy through the deposited material, wherein some of the energy is transmitted;
    receiving the transmitted energy;
    using the received energy, determining a thickness of the deposited material;
    wherein said determining comprises determining a transmissivity of the deposited material;
    wherein said determining a transmissivity comprises producing data from the received energy and associating the produced data with a thickness of the deposited material; wherein said determining a transmissivity further comprises:
    filtering the produced data;
    wherein said passing energy comprises radiating energy and periodically interrupting the radiated energy;
    wherein said interrupting comprises cyclically introducing an energy-blocking surface between a source of the energy and the deposited material;
    further comprising:
    monitoring determined deposition thicknesses by areas of the deposited material;
    determining if a thickness of one or more areas of the deposited material is relatively greater or smaller than other areas of the deposited material;
    based on said determining if a thickness of one or more areas of the deposited material is relatively greater or smaller than other areas of the deposited material, at least one of altering and halting deposition of the material.

11. A method for determining a thickness of a deposited material, the method comprising:
    using an energy source to apply heat at a frequency to the deposited material, whereby the heat conducts through the deposited material and heat radiates from the deposited material;
    receiving the radiated heat from the deposited material;
    determining the thickness based on the received radiated heat;
    wherein said receiving uses an infrared camera;
    wherein the infrared camera receives images in synchronization with the frequency of the applied heat;
    wherein the received radiated heat produces a thermal response;
    further comprising:
    scaling the thermal response by the magnitude of a maximum response.

12. The method of claim 11 wherein the material is deposited on a substrate, and wherein the maximum response is based on a thermal response when the substrate is uncovered by the deposited material.

13. The method of claim 12 wherein said determining the thickness comprises associating the scaled thermal response with a thickness of the deposited material.

14. The method of claim 13 wherein said associating comprises:

determining a signal attenuation based on the scaled thermal response;

associating the determined signal attenuation with a thickness of the deposited material.

15. The method of claim 14 wherein said determining the thickness further comprises calibrating the determined signal attenuation using material properties of the deposited material.

16. A system for determining a thickness of a deposited material on a substrate, the system comprising:

a source of radiating energy positioned to pass energy through the substrate and through the deposited material;

means for receiving energy transmitted through the deposited material;

means for determining the thickness based on the received energy;

means for periodically interrupting radiating energy between said source and the substrate;

wherein said means for receiving comprises a camera;

wherein the camera is synchronized with said means for interrupting.

17. A system for determining a thickness of a deposited material on a substrate, the method comprising:

a source of radiating energy positioned to pass energy through the substrate and through the deposited material;

means for receiving energy transmitted through the deposited material;

means for determining the thickness based on the received energy;

wherein said source is configured to radiate energy at a determined frequency;

wherein said means for receiving energy is synchronized with the determined frequency;

wherein the material is deposited inside a chamber, and wherein said means for receiving energy comprises a camera that is disposed outside the chamber.

18. A system for determining a thickness of a deposited material on a substrate, the method comprising:

a source of radiating energy positioned to pass energy through the substrate and through the deposited material;

means for receiving energy transmitted through the deposited material;

means for determining the thickness based on the received energy;

wherein the material is deposited inside a chamber, and wherein the camera is disposed outside of the chamber;

wherein the chamber further comprises a window through which the camera receives the transmitted energy;

wherein the transmitted energy produces a thermal response;

wherein said means for determining determines the thickness by imaging the received thermal response;

wherein the system further comprises means for scaling the thermal response by the magnitude of a maximum response.

19. The system of claim 18 further comprising:

means for associating the scaled thermal response with a thickness of the deposited material.

20. The system of claim 19 wherein said means for associating comprises:

means for determining a transmissivity based on the scaled thermal response;

means for associating the determined transmissivity with a thickness of the deposited material.

21. The system of claim 20 further comprising means for calibrating the determined transmissivity using material properties of the deposited material.

\* \* \* \* \*

UNITED STATES PATENT AND TRADEMARK OFFICE
CERTIFICATE OF CORRECTION

PATENT NO. : 7,301,149 B2  Page 1 of 1
APPLICATION NO. : 10/839967
DATED : November 27, 2007
INVENTOR(S) : Thomas J. Mackin et al.

It is certified that error appears in the above-identified patent and that said Letters Patent is hereby corrected as shown below:

In the Specification:

Col. 11, line 23    Please delete "(7)" and insert --(8)-- therefor.

Signed and Sealed this

Thirteenth Day of May, 2008

JON W. DUDAS
*Director of the United States Patent and Trademark Office*